(12) United States Patent
Chan et al.

(10) Patent No.: US 11,658,852 B2
(45) Date of Patent: May 23, 2023

(54) SIGNAL RELAY APPARATUS AND METHOD HAVING FREQUENCY CALIBRATION MECHANISM

(71) Applicant: REALTEK SEMICONDUCTOR CORPORATION, Hsinchu (TW)

(72) Inventors: Chun-Chieh Chan, Hsinchu (TW); Tai-Jung Wu, Hsinchu (TW); Chia-Hao Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/848,761

(22) Filed: Jun. 24, 2022

(65) Prior Publication Data
US 2023/0046082 A1 Feb. 16, 2023

(30) Foreign Application Priority Data
Aug. 10, 2021 (TW) .................................. 110129416

(51) Int. Cl.
*H04L 25/24* (2006.01)
*H04L 25/02* (2006.01)

(52) U.S. Cl.
CPC ........ *H04L 25/242* (2013.01); *H04L 25/0272* (2013.01)

(58) Field of Classification Search
CPC ..... H04L 25/0272; H04L 25/20; H04L 25/24; H04L 25/242; H04B 1/38; H04B 1/40; H04B 3/36; H04B 3/40; H04B 3/46
USPC ....... 375/211, 214, 215, 219, 220, 257, 364; 370/282, 293
See application file for complete search history.

(56) References Cited

U.S. PATENT DOCUMENTS

| 8,477,444 | B1 * | 7/2013 | Zou | G11B 5/746 360/78.09 |
|---|---|---|---|---|
| 9,497,018 | B2 * | 11/2016 | Ando | H04L 7/0041 |
| 2012/0307712 | A1 * | 12/2012 | Watanabe | H04B 7/2606 370/315 |

(Continued)

FOREIGN PATENT DOCUMENTS

TW 202201954 A 1/2022

*Primary Examiner* — Young T. Tse
(74) *Attorney, Agent, or Firm* — WPAT, P.C

(57) ABSTRACT

The present invention discloses a signal relay apparatus having frequency calibration mechanism that includes a clock generation circuit, a frequency generation circuit, a clock measuring circuit, a frequency adjusting circuit and a transmission circuit. The clock generation circuit generates a source clock signal. The frequency generation circuit receives the source clock signal and generates a target frequency signal according to a conversion parameter. The clock measuring circuit measures a first frequency offset of a source frequency relative to a first predetermined frequency according to an external reference clock signal. The frequency adjusting circuit adjusts the conversion parameter according to the first frequency offset when the first frequency offset is not within a first predetermined range such that a second frequency offset of a target frequency relative to a second predetermined frequency is within a second predetermined range. The transmission circuit performs signal transmission according to the target frequency signal.

18 Claims, 4 Drawing Sheets

100

100

(56) References Cited

U.S. PATENT DOCUMENTS

2020/0136597 A1\* 4/2020 Chiu .................... H03K 3/0315
2021/0409642 A1 12/2021 Chan \* cited by examiner

SIGNAL RELAY APPARATUS AND METHOD HAVING FREQUENCY CALIBRATION MECHANISM

BACKGROUND OF THE INVENTION

1. Field of the Invention

The present invention relates to a signal relay apparatus and a signal relay method having frequency calibration mechanism.

2. Description of Related Art

As the electronic apparatuses technology continues to develop, higher and higher demand is placed on the signal transmission speed. Take HDMI 2.1 as an example, such a technology defines a new transmission mode known as Fixed Rate Link (PRL) in order to increase the transmission bandwidth. In such a transmission mode, a handshake is performed before the signal is started to be transmitted to detect whether the quality of the signal transmitted under high speed matches the requirements of HDMI 2.1. If a FRL connection is established, the bandwidth can be supported up to 12 Gbps.

Under such a condition, when the signal relay apparatus is used to perform high speed data transmission, a clock signal generated by using crystal-oscillating technology is needed to maintain the accuracy. However, such a design increases the cost. How to accomplish high accuracy and low cost at the same time for the design of signal relay apparatus becomes challenging.

SUMMARY OF THE INVENTION

In consideration of the problem of the prior art, an object of the present invention is to supply a signal relay apparatus and a signal relay method having frequency calibration mechanism.

The present invention discloses a signal relay apparatus having frequency calibration mechanism that includes a clock generation circuit, a frequency generation circuit, a clock measuring circuit, a frequency adjusting circuit and a transmission circuit. The clock generation circuit is configured to generate a source clock signal. The frequency generation circuit is configured to receive the source clock signal and generate a target frequency signal according to a conversion parameter. The clock measuring circuit is configured to measure a first frequency offset of a source frequency of the source clock signal relative to a first predetermined frequency according to an external reference clock signal. The frequency adjusting circuit is configured to, when the first frequency offset is not within a first predetermined range, adjust the conversion parameter of the frequency generation circuit according to the first frequency offset such that a second frequency offset of a target frequency of the target frequency signal relative to a second predetermined frequency is within a second predetermined range. The transmission circuit is configured to perform signal transmission according to the target frequency signal.

The present invention also discloses a signal relay method having frequency calibration mechanism used in a signal relay apparatus that includes steps outlined below. A source clock signal is generated by a clock generation circuit. The source clock signal is received and a target frequency signal is generated according to a conversion parameter by a frequency generation circuit. A first frequency offset of a source frequency of the source clock signal relative to a first predetermined frequency is measured by a clock measuring circuit according to an external reference clock signal. The conversion parameter of the frequency generation circuit is adjusted, when the first frequency offset is not within a first predetermined range, by a frequency adjusting circuit according to the first frequency offset such that a second frequency offset of a target frequency of the target frequency signal relative to a second predetermined frequency is within a second predetermined range. Signal transmission is performed by a transmission circuit according to the target frequency signal.

These and other objectives of the present invention will no doubt become obvious to those of ordinary skill in the art behind reading the following detailed description of the preferred embodiments that are illustrated in the various figures and drawings.

DETAILED DESCRIPTION OF THE PREFERRED EMBODIMENTS

An aspect of the present invention is to provide a signal relay apparatus and a signal relay method having frequency calibration mechanism to adjust a frequency offset of a target frequency signal of a frequency generation circuit according to a frequency offset of a source clock signal such that the accuracy of a clock signal generated by the frequency generation circuit can be maintained under a low cost condition that generates the clock signal without using a crystal-oscillating technology.

Figure 1A:
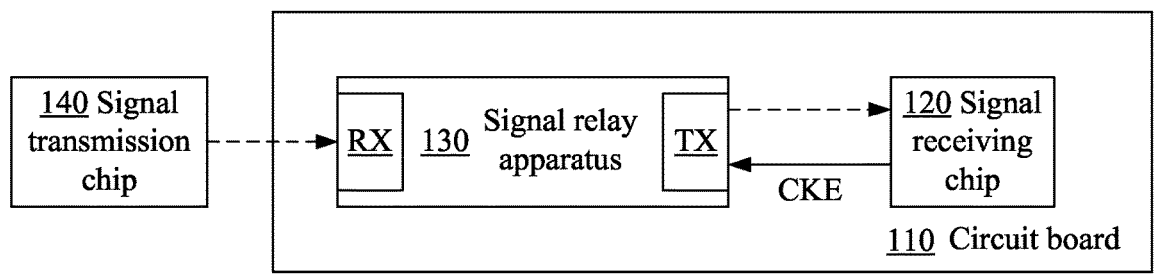
FIG. 1A and FIG. 1B respectively illustrate a block diagram of an electronic apparatus according to an embodiment of the present invention.
Figure 1B:
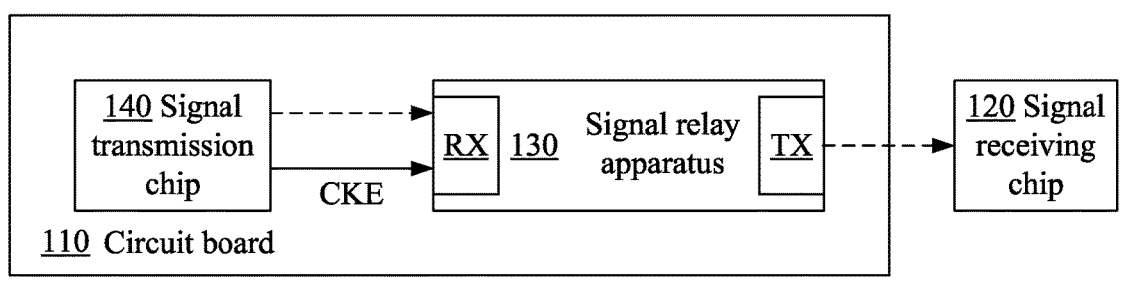

Reference is now made to FIG. 1A and FIG. 1B at the same time. FIG. 1A and FIG. 1B respectively illustrate a block diagram of an electronic apparatus 100 according to an embodiment of the present invention.

In the embodiment of FIG. 1A, the electronic apparatus 100 includes a circuit board 110, a signal receiving chip 120 and a signal relay apparatus 130 having frequency calibration mechanism. The signal receiving chip 120 and the signal relay apparatus 130 are disposed on the circuit board 110.

The electronic apparatus 100 can perform communication with another electronic apparatus (not illustrated in the figure) that includes a signal transmission chip 140 based on one of the transmission interface formats of such as, but not limited to High Definition Multimedia Interface (HDMI), DisplayPort (DP) and Universal Serial Bus (USB) Type-C.

In FIG. 1A, the signal relay apparatus 130 is disposed between the signal receiving chip 120 and the signal transmission chip 140, and is configured to perform signal relay transmission between the signal receiving chip 120 and the signal transmission chip 140. For example, the electronic apparatus 100 that includes the signal receiving chip 120 operates as a signal receiving terminal (sink), which can be such as, but not limited to a television or a display apparatus. The other electronic apparatus that includes the signal transmission chip 140 operates as a signal transmission terminal (source), which can be such as, but not limited to a notebook personal computer or a DVD player. As a result, the signal receiving chip 120 receives the signal from the signal transmission chip 140 through the signal relay apparatus 130 and performs processing thereon, such as but not limited to processing and displaying an image signal.

The signal relay apparatus 130 includes a transmission circuit TX and a receiving circuit RX. As illustrated in FIG. 1A, a dashed line path is shown that allows the signal relay apparatus 130 receives a signal from the signal transmission chip 140 by using the receiving circuit RX and transmits the signal to the signal receiving chip 120 by using the transmission circuit TX.

On the contrary, in the embodiment of FIG. 1B, the electronic apparatus 100 includes the circuit board 110, the signal transmission chip 140 and the signal relay apparatus 130 having frequency calibration mechanism. The signal transmission chip 140 and the signal relay apparatus 130 are disposed on the circuit board 110.

The electronic apparatus 100 can perform communication with another electronic apparatus (not illustrated in the figure) that includes the signal receiving chip 120 based on one of the transmission interface formats of HDMI, DP and USB Type-C.

In FIG. 1B, the signal relay apparatus 130 is also disposed between the signal receiving chip 120 and the signal transmission chip 140, and is configured to perform signal relay transmission between the signal receiving chip 120 and the signal transmission chip 140. For example, the electronic apparatus 100 that includes the signal transmission chip 140 operates as the signal transmission terminal, which can be such as, but not limited to a notebook personal computer or a DVD player. The other electronic apparatus that includes the signal receiving chip 120 operates as a signal receiving terminal, which can be such as, but not limited to a television or a display apparatus. As a result, the signal transmission chip 140 receives the signal from the signal receiving chip 120 through the signal relay apparatus 130 and performs processing thereon, such as but not limited to processing and displaying an image signal.

Similarly, the signal relay apparatus 130 includes the transmission circuit TX and the receiving circuit RX. As illustrated in FIG. 1B, the signal relay apparatus 130, a dashed line path is shown that allows the signal relay apparatus 130 receives a signal from the signal transmission chip 140 by using the receiving circuit RX and transmits the signal to the signal receiving chip 120 by using the transmission circuit TX.

The signal relay apparatus 130 performs signal relay transmission based on the transmission interface format of the signal receiving chip 120 and the signal transmission chip 140 to prevent the signal attenuation due to the long distance of the connection wire (e.g., HDMI wire) between the signal receiving chip 120 and the signal transmission chip 140 or the circuit board wire.

For example, the signal relay apparatus 130 performs signal relay transmission based on one of the transmission interface formats of HDMI, DP and USB Type-C. In different embodiments, the signal relay apparatus 130 can be such as, but not limited to a retimer or a redriver.

It is appreciated that the configuration that disposes the signal relay apparatus 130 between the signal receiving chip 120 and the signal transmission chip 140 is only an example.

In other embodiments, the signal relay apparatus 130 can be disposed in any two circuits included in the electronic apparatus 100 based on practical requirements.

The configuration and operation of the signal relay apparatus 130 are described in detail in the following paragraphs.

Figure 2:
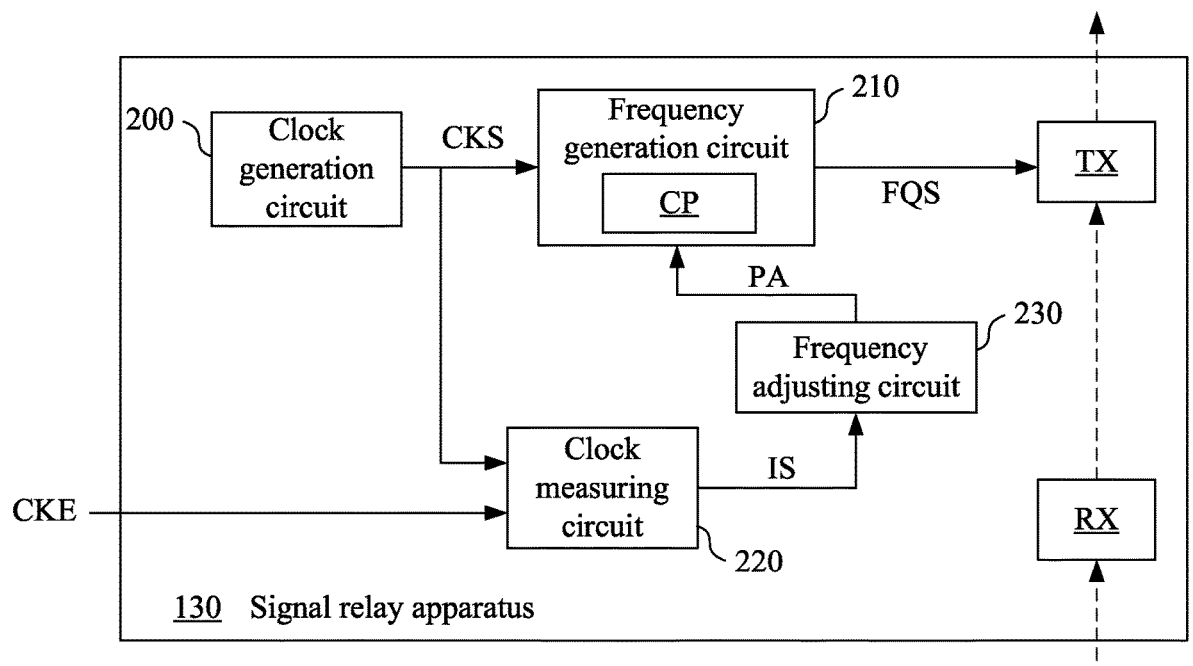
FIG. 2 illustrates a more detailed circuit diagram of the signal relay apparatus according to an embodiment of the present invention.

Reference is now made to FIG. 2. FIG. 2 illustrates a more detailed circuit diagram of the signal relay apparatus 130 according to an embodiment of the present invention.

As illustrated in FIG. 2, besides the transmission circuit TX and the receiving circuit RX, the signal relay apparatus 130 further includes a clock generation circuit 200, a frequency generation circuit 210, a clock measuring circuit 220 and a frequency adjusting circuit 230.

The clock generation circuit 200 is configured to generate a source clock signal CKS. The frequency generation circuit 210 is configured to receive the source clock signal CKS and generate a target frequency signal FQS according to a conversion parameter CP. More specifically, the frequency generation circuit 210 is configured to up-convert the frequency of the source clock signal CKS having a source frequency according to the conversion parameter CP to generate the target frequency signal FQS having a target frequency. The transmission circuit TX is configured to perform signal transmission according to the target frequency signal FQS.

It is appreciated that in an embodiment, the clock generation circuit 200, the frequency generation circuit 210, the clock measuring circuit 220 and the frequency adjusting circuit 230 can also be integrated with the circuits included in the transmission circuit TX and become a part of the transmission circuit TX. The present invention is not limited thereto.

Under the condition that the circuits are not influenced by the temperature, the source frequency of the source clock signal CKS is kept to be a first predetermined frequency. The target frequency of the target frequency signal FQS is kept to be a second predetermined frequency. In a numerical example, the first predetermined frequency can be such as, but not limited to 27 MHz, and the second predetermined frequency can be such as, but not limited to 3 GHz, 8 GHz or 12 GHz depending on practical requirements.

In an embodiment, the clock generation circuit 200 is such as, but not limited to a LC tank circuit to generate the source clock signal CKS according to a non-crystal-oscillating technology. However, the non-crystal-oscillating technology is easy to be influenced by temperature variation such that the source frequency of the source clock signal CKS deviates from the first predetermined frequency. When the conversion parameter CP does not vary, the target frequency of the target frequency signal FQS generated by the frequency generation circuit 210 also deviates from the second predetermined frequency.

When the transmission circuit TX of the signal relay apparatus 130 performs signal relay transmission according to the target frequency signal FQS based on the transmission interface formats described above (HDMI, DP or USB Type-C), the target frequency of the target frequency signal FQS may deviate from the second predetermined frequency for an amount that is too large to match the specification of these transmission interface formats.

The clock measuring circuit 220 is configured to measure a first frequency offset of the source frequency of the source clock signal CKS relative to the first predetermined range according to an external reference clock signal CKE. The external reference clock signal CKE is provided by an element disposed on the circuit board 110 and outside of the signal relay apparatus 130, such as but not limited to the signal receiving chip 120 illustrated in FIG. 1A or the signal transmission chip 140 illustrated in FIG. 1B.

In an embodiment, a variation amount of an average frequency of the external reference clock signal CKE within a predetermined time interval is smaller than a predetermined value. More specifically, unlike the clock signal generated by the crystal oscillating technology that has no jitter, the external reference clock signal CKE is only required to be stable within a certain time interval and jitters are allowed to be presented.

In an embodiment, the clock measuring circuit 220 calculates the frequency offset by comparing cycle counts between the source clock signal CKS and the external reference clock signal CKE. The cycle counts can be obtained by accumulating rising edges of each of the clock signals.

Figure 3:
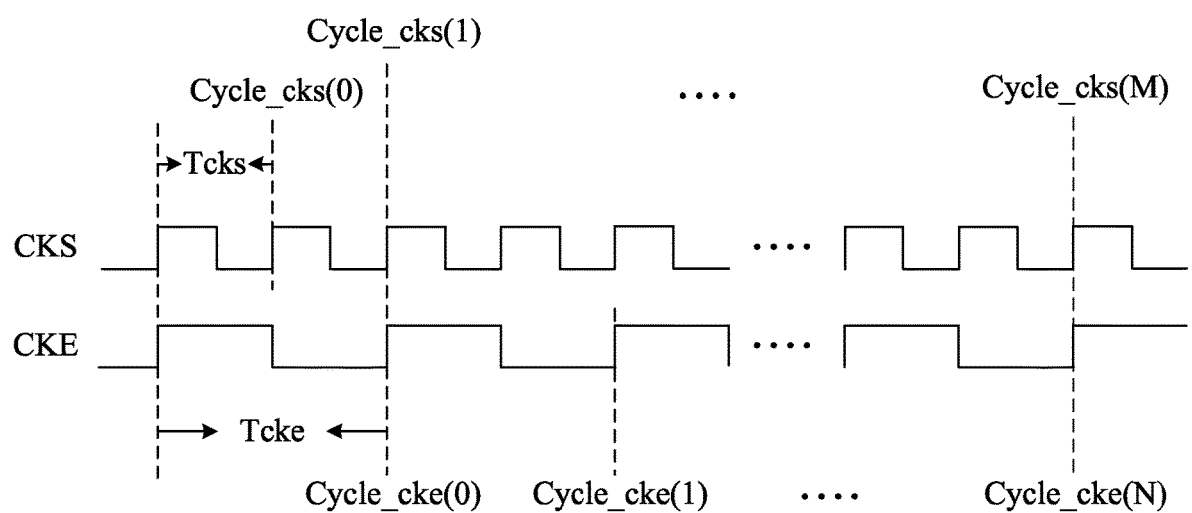
FIG. 3 illustrates a diagram of the source clock signal and the external reference clock signal according to an embodiment of the present invention.

Reference is now made to FIG. 3. FIG. 3 illustrates a diagram of the source clock signal CKS and the external reference clock signal CKE according to an embodiment of the present invention.

As illustrated in FIG. 3, the source clock signal CKS has a cycle length Tcks (equivalent to the reciprocal of the source frequency Fcks) and has a plurality of cycles Cycle_cks. The external reference clock signal CKE has a cycle length Tcke (equivalent to the reciprocal of a reference frequency Fcke) and has a plurality of cycles Cycle_cke. If a frequency ratio between the source clock signal CKS and the external reference clock signal CKE is M/N, the relation thereof can be expressed by the following equation:

Tcke*Cycle_cke(N)=Tcks*Cycle_cks(M)    (equation 1)

In a numerical example, the source frequency of the source clock signal CKS is 27 MHz and a reference frequency of the external reference clock signal CKE is 14.318 MHz. If the external reference clock signal CKE is measured to have 8000 cycles, the relation thereof with the source clock signal CKS can be expressed by the following equation:

(1/14.318)*8000=(1/Fcks)*Cycle_cks    (equation 2)

As a result, when the measured cycle count Cycle_cks is 15086, the source frequency of the source clock signal CKS Fcks is precisely 27 MHz. When the measured cycle counts Cycle_cks is 15091, the source frequency of the source clock signal CKS Fcks becomes 27.009 MHz, which deviates from 27 MHz by 333 parts per million (ppm). Such a deviation amount exceeds 300 ppm.

The frequency adjusting circuit 230 is configured to adjust the conversion parameter CP of the frequency generation circuit 210 according to the first frequency offset when the first frequency offset is not within a first predetermined range, such that the second frequency offset of the target frequency of the target frequency signal FQS relative to the second predetermined frequency is within a second predetermined range. More specifically, when a difference of the source frequency of the source clock signal CKS from the first predetermined frequency is too high or too low, the frequency adjusting circuit 230 can adjust the conversion parameter CP such that the difference of the target frequency of the target frequency signal FQS from the second predetermined frequency is not too high or not too low.

For the target frequency, the term "within the second predetermined range" means the target frequency signal FQS matches the specification of the transmission interface format and the target frequency is within a range that the specification tolerates. For example, in standard protocol of HDMI 2.1, the timing of the transmission terminal is required to have a deviation amount less than 300 Hz within 1 MHz (300 ppm). Each of the other transmission interface formats of HDMI, DP or USB Type-C also has a corresponding tolerable range. The detail is not described herein. Correspondingly, if the second predetermined range is the requirement of the deviation amount that is not less than 300 Hz within 1 MHz, the term "within the first predetermined range" also means that the timing of the source frequency of the source clock signal CKS is required to have the deviation amount less than 300 Hz within 1 MHz.

In an embodiment, the frequency adjusting circuit 230 can be such as, but not limited to a 8051 control chip or other chips that can execute software or firmware. The clock measuring circuit 220 generates an interrupt signal IS to the frequency adjusting circuit 230 when the measured first frequency offset is not within the first predetermined range. In an embodiment, such an interrupt signal IS includes information of the first frequency offset such that the frequency adjusting circuit 230 calculates the parameter adjusting amount PA according to the first frequency offset and adjusts the conversion parameter CP of the frequency generation circuit 210 according to the parameter adjusting amount PA.

After the conversion parameter CP is adjusted, the frequency generation circuit 210 can make the second frequency offset of the target frequency of the target frequency signal FQS relative to the second predetermined frequency be within the second predetermined range. The signal relay transmission performed by the transmission circuit TX can therefore match the specification of the corresponding transmission interface format.

In an embodiment, when the first frequency offset is within the first predetermined range, the frequency adjusting circuit 230 does not adjust the conversion parameter CP.

As a result, the signal relay apparatus of the present invention measures the first frequency offset of the source frequency of the source clock signal relative to the first predetermined frequency so as to adjust the conversion parameter of the frequency generation circuit when the first frequency offset is not within the first predetermined range. The second frequency offset of the target frequency of the target frequency signal relative to the second predetermined frequency can be kept within the second predetermined range such that the accuracy of the clock signal generated by the frequency generation circuit can be maintained under a low cost condition that generates the clock signal without using a crystal-oscillating technology.

Figure 4:
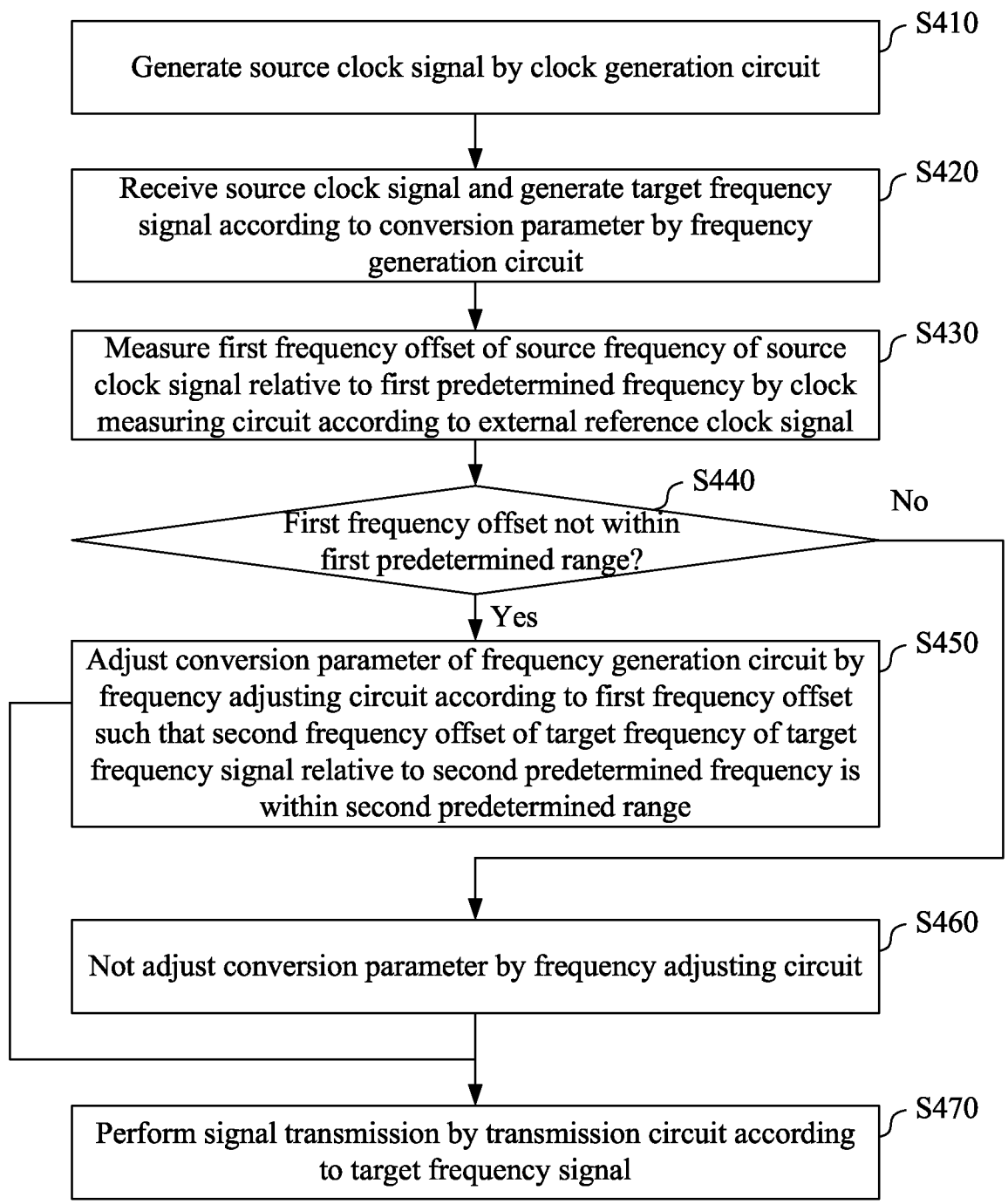
FIG. 4 illustrates a flow chart of a signal relay method having frequency calibration mechanism according to an embodiment of the present invention.

Reference is now made to FIG. 4. FIG. 4 illustrates a flow chart of a signal relay method 400 having frequency calibration mechanism according to an embodiment of the present invention.

In addition to the apparatus described above, the present invention further provides the signal relay method 400 having frequency calibration mechanism that can be used in such as, but not limited to, the signal relay apparatus 130 in FIG. 2. As illustrated in FIG. 4, an embodiment of the signal relay method 400 includes the following steps.

In step S410, the source clock signal CKS is generated by the clock generation circuit 200.

In step S420, the source clock signal CKS is received and the target frequency signal FQS is generated according to the conversion parameter CP by the frequency generation circuit 210.

In step S430, the first frequency offset of the source frequency of the source clock signal CKS relative to the first predetermined frequency is measured by the clock measuring circuit 220 according to the external reference clock signal CKE.

In step S440, whether the first frequency offset is not within the first predetermined range is determined. In an embodiment, the determination of the first frequency offset is performed by the clock measuring circuit 220. The clock measuring circuit 220 transmits the interrupt signal IS to the frequency adjusting circuit 230 when the first frequency offset is determined to be not within the first predetermined range.

In step S450, the conversion parameter CP of the frequency generation circuit 210 is adjusted, when the first frequency offset is not within the first predetermined range, by the frequency adjusting circuit 230 according to the first frequency offset such that the second frequency offset of the target frequency of the target frequency signal FQS relative to the second predetermined frequency is within the second predetermined range.

In step S460, the frequency adjusting circuit 230 does not adjust the conversion parameter CP when the first frequency offset is within the first predetermined range.

In step S470, after step S450 or step S460 is performed, signal transmission is performed by the transmission circuit TX according to the target frequency signal FQS.

It is appreciated that the embodiments described above are merely an example. In other embodiments, it should be appreciated that many modifications and changes may be made by those of ordinary skill in the art without departing from the spirit of the disclosure.

In summary, the present invention discloses the signal relay apparatus and the signal relay method having frequency calibration mechanism to adjust a frequency offset of a target frequency signal of a frequency generation circuit according to a frequency offset of a source clock signal such that the accuracy of a clock signal generated by the frequency generation circuit can be maintained under a low cost condition that generates the clock signal without using a crystal-oscillating technology.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A signal relay apparatus having frequency calibration mechanism, comprising:
   a clock generation circuit configured to generate a source clock signal;
   a frequency generation circuit configured to receive the source clock signal and generate a target frequency signal according to a conversion parameter;
   a clock measuring circuit configured to measure a first frequency offset of a source frequency of the source clock signal relative to a first predetermined frequency according to an external reference clock signal;
   a frequency adjusting circuit configured to, when the first frequency offset is not within a first predetermined range, adjust the conversion parameter of the frequency generation circuit according to the first frequency offset such that a second frequency offset of a target frequency of the target frequency signal relative to a second predetermined frequency is within a second predetermined range; and
   a transmission circuit configured to perform signal transmission according to the target frequency signal.

2. The signal relay apparatus of claim 1, wherein the clock measuring circuit generates an interrupt signal to the frequency adjusting circuit when the first frequency offset is not within the first predetermined range.

3. The signal relay apparatus of claim 1, wherein the frequency adjusting circuit is configured to calculate an parameter adjusting amount according to the first frequency offset, so as to adjust the conversion parameter of the frequency generation circuit according to the parameter adjusting amount.

4. The signal relay apparatus of claim 1, wherein the clock generation circuit generates the source clock signal according to a non-crystal-oscillating technology.

5. The signal relay apparatus of claim 1, wherein the external reference clock signal has a variation amount of an average frequency within a predetermined time interval that is smaller than a predetermined value.

6. The signal relay apparatus of claim 1, wherein the signal relay apparatus is disposed between a signal transmission chip and a signal receiving chip, wherein one of the signal transmission chip and the signal receiving chip provides the external reference clock signal.

7. The signal relay apparatus of claim 6, wherein the signal relay apparatus further comprises a receiving circuit such that the signal relay apparatus performs signal relay transmission between the signal transmission chip and the signal receiving chip by using the transmission circuit and the receiving circuit.

8. The signal relay apparatus of claim 1, wherein the signal relay apparatus performs signal relay transmission based on one of transmission interfaces of High Definition Multimedia Interface (HDMI), DisplayPort (DP) and Universal Serial Bus (USB).

9. The signal relay apparatus of claim 1, wherein the signal relay apparatus is a retimer or a redriver.

10. A signal relay method having frequency calibration mechanism used in a signal relay apparatus, comprising:
    generating a source clock signal by a clock generation circuit;
    receiving the source clock signal and generating a target frequency signal according to a conversion parameter by a frequency generation circuit;
    measuring a first frequency offset of a source frequency of the source clock signal relative to a first predetermined frequency by a clock measuring circuit according to an external reference clock signal;
    adjusting the conversion parameter of the frequency generation circuit, when the first frequency offset is not within a first predetermined range, by a frequency adjusting circuit according to the first frequency offset such that a second frequency offset of a target frequency of the target frequency signal relative to a second predetermined frequency is within a second predetermined range; and
    performing signal transmission by a transmission circuit according to the target frequency signal.

11. The signal relay method of claim 10, further comprising:
    generating an interrupt signal to the frequency adjusting circuit by the clock measuring circuit when the first frequency offset is not within the first predetermined range.

12. The signal relay method of claim 10, further comprising:

calculating an parameter adjusting amount by the frequency adjusting circuit according to the first frequency offset, so as to adjust the conversion parameter of the frequency generation circuit according to the parameter adjusting amount.

13. The signal relay method of claim 10, further comprising:

generating the source clock signal by the clock generation circuit according to a non-crystal-oscillating technology.

14. The signal relay method of claim 10, wherein the external reference clock signal has a variation amount of an average frequency within a predetermined time interval that is smaller than a predetermined value.

15. The signal relay method of claim 10, wherein the signal relay apparatus is disposed between a signal transmission chip and a signal receiving chip, wherein one of the signal transmission chip and the signal receiving chip provides the external reference clock signal.

16. The signal relay method of claim 15, wherein the signal relay apparatus further comprises a receiving circuit, and the signal relay method further comprises:

performing signal relay transmission by the signal relay apparatus between the signal transmission chip and the signal receiving chip by using the transmission circuit and the receiving circuit.

17. The signal relay method of claim 10, further comprising:

performing signal relay transmission by the signal relay apparatus based on one of transmission interfaces of High Definition Multimedia Interface (HDMI), DisplayPort (DP) and Universal Serial Bus (USB).

18. The signal relay method of claim 10, wherein the signal relay apparatus is a retimer or a redriver.

\* \* \* \* \*